Nov. 15, 1960 F. M. YOUNG 2,960,668

VOLTAGE CONTROLLED OSCILLATOR

Filed May 2, 1957

INVENTOR.
F. MANSFIELD YOUNG

BY Joseph Weingarten

United States Patent Office 2,960,668

Patented Nov. 15, 1960

2,960,668

VOLTAGE CONTROLLED OSCILLATOR

Frink Mansfield Young, Boston, Mass., assignor to Epsco, Incorporated, Boston, Mass., a corporation of Massachusetts Filed May 2, 1957, Ser. No. 656,706

1 Claim. (Cl. 331—145)

Figure 1:
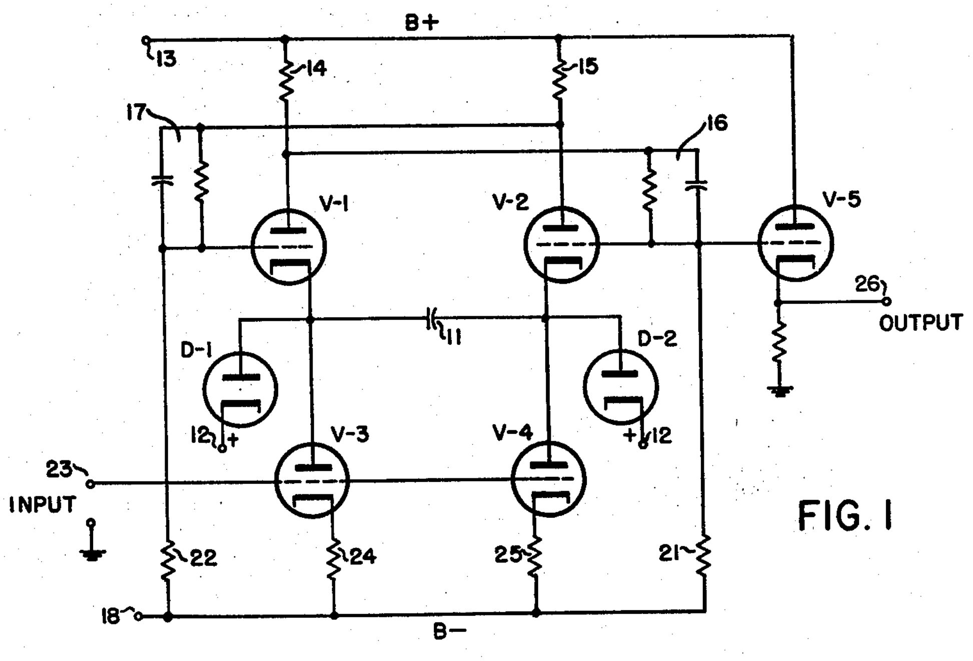

The present invention relates in general to electrical signal generation and more particularly concerns a novel circuit which provides an output signal of substantially rectangular waveform whose frequency is linearly related to the instantaneous amplitude of an input signal. This linear relation is retained despite extensive variations in input signal amplitude, thereby permitting correspondingly wide deviations in the frequency of the output signal. Though generally applicable in the frequency modulation art, the novel circuit is especially useful as an analog-to-pulse-rate conversion device.

Virtually innumerable frequency and phase modulators have been described in the patents and literature. One of the most frequently used circuits for providing a frequency-modulated output signal employs an oscillator having a frequency determining impedance element, such as an LC tank circuit, shunted by a voltage sensitive reactance tube. By applying the input signal to the reactance tube grid, the instaneous oscillator frequency may be caused to follow accordingly. Although conventional circuits of this type will perform satisfactorily in communications equipment and the like, difficulties inherent in electronic impedance devices are encountered which preclude their use in systems with rigid specifications as to linearity in the relationship between output frequency and input signal amplitude, as to center frequency stability, and as to the dynamic range of frequency deviation within preestablished linearity tolerances.

The present invention contemplates and has as a primary object the provision of a circuit which furnishes an output signal whose instantaneous frequency is linearly related to the instantaneous amplitude of an input signal despite exceedingly broad variations in input signal amplitude which effect correspondingly wide frequency excursions about a stable center frequency.

Another object of this invention is to provide a voltage sensitive oscillator circuit which employs a relatively small number of inexpensive, standard components arranged whereby the number of critical parameter values is minimized.

Broadly speaking, the present invention comprises a bistable circuit whose timing is determined by a storage element and associated control circuit. More specifically, the cathodes of the two tubes constituting a free-running multivibrator circuit are coupled together by a timing capacitor. These cathodes are individually clamped to a predetermined potential by respective clamping diodes, whereby the timing capacitor assumes an initial charge condition in the interval during which the multivibrator circuit switches from one state to another. During the time the multivibrator circuit resides in one of its two stable states, energy is exchanged through a substantially constant current tube connected in the cathode circuit of the multivibrator tube then non-conducting, thereby maintaining the rate of change of charge upon the timing capacitor substantially constant.

The input signal is applied to the control grid of the constant current tube, thereby controlling the value of the rate of change of charge upon the timing capacitor. The voltage of the cathode of the non-conducting multivibrator tube changes linearly until it reaches a value where the grid-cathode potential rises above cutoff, at which time the tube begins to conduct. Cross-coupling means from the plate of each multivibrator tube to the grid of the other transfers a potential to the conducting and previously non-conducting tubes, effective to render the former non-conductive, and rapidly accelerating the change of the latter to the conductive state. Thus, the switching time of the multivibrator is proportional to the rate of change in charge upon the timing capacitor which in turn is controlled by the constant current tube. Since there is a high resistance in the cathode circuit of the constant current tube, the value of the constant current is linearly related to the instantaneous amplitude of the input signal.

Figure 2:
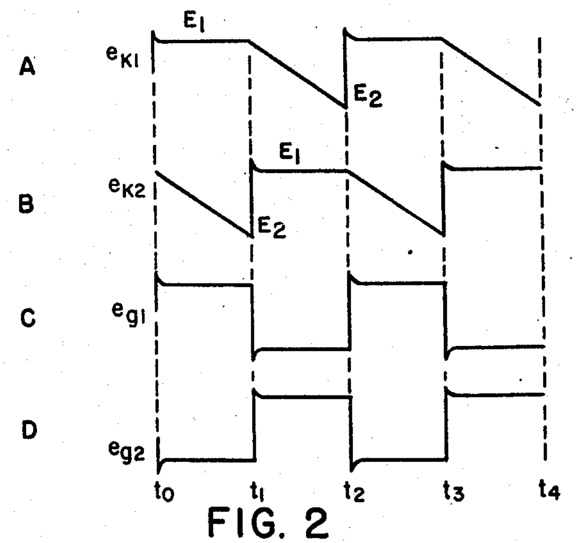

Other features, objects and advantages of the invention will become apparent from the following specification when read in connection with the accompanying drawing in which:

Fig. 1 is a schematic circuit diagram of a preferred embodiment of the invention; and Fig. 2 is a graphical representation of signal waveforms appearing at designated points in the circuit of Fig. 1 pertinent to understanding the mode of operation of the invention.

With reference now to the drawing, and more particularly Fig. 1 thereof, there is illustrated a schematic circuit diagram of a representative embodiment of the voltage controlled oscillator. The cathodes of multivibrator tubes V–1 and V–2 are coupled through timing capacitor 11. Each of these cathodes is clamped to a positive potential applied to terminals 12—12 by diodes D–1 and D–2, respectively. A source of positive potential appearing at terminal 13 is coupled to the plates of V–1 and V–2 through load resistors 14 and 15, respectively. The plates of V–1 and V–2 are respectively cross-coupled to the grids of V–2 and V–1 through resistance-capacitance transfer networks 16 and 17 respectively. These grids are also returned to a source of negative potential applied on terminal 18 through grid resistors 21 and 22, respectively.

A pair of constant current triodes V–3 and V–4 are arranged with their plates connected to the cathodes of V–1 and V–2 respectively and their grids energized in parallel from input signal terminal 23. Resistances 24 and 25, of relatively high value, are connected between the source of negative potential at terminal 18 and the cathodes of V–3 and V–4 respectively. The rectangular waveform output signal, whose frequency is controlled by the input signal applied at terminal 23, is derived from the grid of V–2 and coupled to output terminal 26 through cathode follower V–5.

Having described the physical configuration of the circuit, its mode of operation will be considered. The multivibrator circuit may assure either of two states, one with V–1 conducting and V–2 non-conducting; the other, with V–2 conducting and V–1 non-conducting. It is convenient to assume that initially, the circuit resides in the first of these states.

With reference now to Fig. 2, graphical representations of signal waveforms which appear at designated points of the circuit of Fig. 1 are plotted on a common time scale. With particular reference to Figs. 2A and 2B, the voltage waveforms which appear on the cathodes of tubes V–1 and V–2 are respectively designated $e_{K1}$ and $e_{K2}$. It is seen that these voltages vary between limits designated $E_1$ and $E_2$.

Under the assumption that conduction has just been initiated in at time $t_0$, the cathode potential on tube V–1 has just been returned to the clamping potential $E_1$, where it will remain while V–1 conducts. At this time the cathode of tube V–2 is still at the clamping potential $E_1$ maintained during the preceding time interval in which tube V–2 was conducting. Hence, the voltage across timing capacitor 11 is substantially zero and no charge is stored therein. Capacitor 11 now charges through a path which includes tube V–4, resistor 25, and diode D–1, in parallel with the series combination of resistor 14 and tube V–1. The high value of resistor 25 introduces a large amount of degeneration which results in the current therethrough being maintained at a substantially constant value for a fixed value of applied grid voltage, despite the decreasing plate voltage which results as capacitor 11 charges. Since the charging current remains constant, the rate of change of charge upon capacitor 11 is constant, resulting in a linear decrease in voltage on the cathode of tube V–2 as illustrated in Fig. 2B during the time interval $t_0$ to $t_1$.

Since resistor 25 introduces a large amount of degenerative feedback, the relation between the plate current of V–4 in response to an applied grid voltage is extremely linear over a wide dynamic range of input grid voltages; hence, the slope of the cathode voltage waveforms is linearly related to the input grid voltage applied to tube V–4.

When the cathode of tube V–2 reaches the potential $E_2$, which is at time $t_1$ in Fig. 2, the grid-cathode potential of tube V–2 is such that tube V–2 now begins to conduct. The accompanying drop in voltage at the plate of tube V–2 is coupled by network 17 to the grid of tube V–1, thereby rendering the latter tube non-conductive. The resulting rise in potential on the plate of tube V–1 is coupled by network 16 to the grid of tube V–2, accelerating its change from non-conductivity to conductivity. The multivibrator circuit is then in the second state, wherein tubes V–1 and V–2 are respectively non-conductive and conductive.

As a result of this switchover, capacitor 11 is rapidly discharged and returned to its initial state wherein it stores no charge. During the intreval $t_1$–$t_2$, the voltage waveforms on the cathodes of V–1 and V–2 are reversed from that of the previous time interval and capacitor 11 now charges through constant current tube V–3, resistor 24, and diode D–2 in parallel with the serial combination of resistor 15 and tube V–2. In a manner similar to that described above, the cathode potential of tube V–1 decreases linearly to the potential $E_2$, and at time $t_2$ the grid-cathode potential of tube V–1 rises just above cutoff and the circuit switches back to the first state. Operation of the circuit thereafter is a repetition of the full cycle just described; thus, times $t_3$ and $t_4$ correspond to $t_1$ and $t_2$, respectively.

It is seen that the time required for potential of the cathodes of tubes V–1 and V–2 to change from $E_1$ and $E_2$ is proportional to the rate of change of potential across capacitor 11 which in turn is linearly related to the amplitude of the input signal applied at terminal 23 connected to the grids of V–3 and V–4. Thus, the switching rate of the circuit is linearly related to the amplitude of the input signal.

With reference to Figs. 2C and 2D, the voltage waveform upon the grids of tubes V–1 and V–2 are respectively designated $e_{g1}$ and $e_{g2}$. These are symmetrical rectangular waveforms each with a small spike at the time of switching resulting from the rapid discharge of capacitor 11 through a path which includes the then conducting tube, its associated plate load resistance and the diode connected to the then non-conducting tube. The waveforms are identical except that they are of opposite phase.

In the circuit of Fig. 1, the output signal is derived by coupling the grid voltage waveform which appears upon the grid of tube V–2 to output terminal 26 by means of cathode follower V–5 to provide at a low impedance isolated output the desired frequency modulated wave. The frequency of the output signal is primarily dependent upon the value of timing capacitor 11 and the currents passed by the constant current tubes. The inverse feedback introduced by resistors 24 and 25 results in stable operation of the circuit despite variations in tube characteristics due to aging or change of tubes. Diodes D–1 and D–2 and the clamping potential at terminals 12—12 precisely control the initial conditions upon the capacitor prior to its charging at the controlled linear rate.

A circuit constructed in accordance with these teachings successfully responded to input signals to provide a frequency deviation of ±15 percent of a center frequency of thirty kilocycles, with a deviation from precise linearity of 0.03 percent. Nominal sensitivity is of the order of one percent deviation per volt. Of special importance, the output signal was not amplitude modulated by the input and further no component of the input signal was superimposed upon the output.

Those skilled in the art may now make numerous modifications of and departures from the specific circuit described herein without departing from the inventive concepts. Consequently, the invention is to be construed as limited only by the spirit and scope of the appended claim.

What is claimed is:

Apparatus for providing an output signal of frequency controlled by an input signal comprising, a first pair of electron tubes each having at least a cathode, grid and plate, a first potential source, a load impedance connecting each of said electron tube plates to said first potential source, means for regeneratively cross-coupling the plates of each of said electron tubes to the grid of the other, a timing capacitor directly connecting the cathodes of said first pair of electron tubes, a second potential source and a third potential source intermediate said first and second sources, first and second diodes for respectively clamping said cathodes of said first and second electron tubes to said third potential source, a second pair of electron tubes for current control each having at least a cathode, grid and plate, means for applying said input signal to said grids of said second pair of electron tubes in parallel, said plates of said second pair being connected to the respective cathodes of said first pair of electron tubes, a pair of relatively high resistances respectively coupling said cathodes of said second pair of electron tubes to said second potential source, said resistances being sufficiently high so that the magnitude of current flowing through said current control tubes is determined by the value of said resistances and the amplitude of said input signal while being nearly independent of the parameters of said current control tubes, and means for deriving said output signal from one of said first pair of electron tubes.

References Cited in the file of this patent

UNITED STATES PATENTS

| | | |
|---|---|---|
| 2,456,089 | Shenk et al. | Dec. 14, 1948 |
| 2,633,535 | Daskam | Mar. 31, 1953 |
| 2,644,887 | Wolfe | July 7, 1953 |
| 2,750,502 | Gray | June 12, 1956 |
| 2,846,583 | Goldfischer et al. | Aug. 5, 1958 |
| 2,863,122 | Finkel et al. | Dec. 2, 1958 |